(12) United States Patent  (10) Patent No.: US 9,344,031 B2
Davoren  (45) Date of Patent: May 17, 2016

(54) CONCENTRATOR-DRIVEN, PHOTOVOLTAIC POWER GENERATOR

(71) Applicant: Jeffrey A. Davoren, Loma Mar, CA (US)

(72) Inventor: Jeffrey A. Davoren, Loma Mar, CA (US)

( * ) Notice: Subject to any disclaimer, the term of this patent is extended or adjusted under 35 U.S.C. 154(b) by 28 days.

(21) Appl. No.: 13/969,430

(22) Filed: Aug. 16, 2013

(65) Prior Publication Data

US 2015/0048776 A1     Feb. 19, 2015

(51) Int. Cl.
*H01L 31/052* (2014.01)
*H01L 31/042* (2014.01)
*F24J 2/12* (2006.01)
*H01L 31/054* (2014.01)
*H02J 7/35* (2006.01)
*F24J 2/08* (2006.01)
*F24J 2/54* (2006.01)
*F24J 2/07* (2006.01)

(52) U.S. Cl.
CPC ............ *H02S 20/32* (2014.12); *H01L 31/0547* (2014.12); *H01L 31/0549* (2014.12); *F24J 2/08* (2013.01); *F24J 2/12* (2013.01); *F24J 2/54* (2013.01); *F24J 2002/075* (2013.01); *H02J 7/35* (2013.01); *Y02E 10/47* (2013.01); *Y02E 10/52* (2013.01)

(58) Field of Classification Search
CPC ........................... Y02E 10/52; H01L 31/0547
USPC ........................................................ 136/246
See application file for complete search history.

(56) References Cited

U.S. PATENT DOCUMENTS

| | | | | |
|---|---|---|---|---|
| 3,521,952 | A | * | 7/1970 | Nelson et al. .................... 355/38 |
| 4,021,267 | A | * | 5/1977 | Dettling ........................ 136/246 |
| 7,081,584 | B2 | * | 7/2006 | Mook ............................ 136/246 |
| 2009/0032103 | A1 | * | 2/2009 | Yi .................................. 136/259 |
| 2010/0126584 | A1 | * | 5/2010 | Seol et al. ..................... 136/259 |
| 2011/0049992 | A1 | * | 3/2011 | Sant'Anselmo et al. ....... 307/64 |
| 2011/0079271 | A1 | * | 4/2011 | Dets .............................. 136/247 |

* cited by examiner

*Primary Examiner* — Samuel Berhanu
*Assistant Examiner* — Tarikh Rankine
(74) *Attorney, Agent, or Firm* — Ray K. Shahani, Esq.; Kin Hung Lai

(57) ABSTRACT

A concentrator-driven, photovoltaic power generator system and method for capturing and transmitting electromagnetic radiation utilizing a reflector having a concave reflecting surface for concentrating electromagnetic radiation to a focal point.

10 Claims, 4 Drawing Sheets

CONCENTRATOR-DRIVEN, PHOTOVOLTAIC POWER GENERATOR

FIELD OF THE INVENTION

The present invention relates to a novel and useful solar energy collector system, more particularly a concentrator-driven, photovoltaic power generator for conversion of solar electromagnetic energy to electrical energy.

BACKGROUND OF THE INVENTION

Solar energy has served as a means for generating electricity and heat at an accelerated pace. Although solar energy comprises a very abundant source, conversion to useable forms of energy is expensive.

In the past, many systems have been devised to capture solar radiation. For example, solar panels have been employed in fixed arrays to directly convert solar radiation to electricity. In addition, circulation membranes have been employed to heat water for use within buildings and for use in swimming pools and spas. Other systems employ concave reflectors that concentrate solar radiation substantially at a point, where it is then employed to heat materials or is transferred as light to secondary conversion apparatuses.

For example, U.S. Pat. Nos. 4,841,946 and 5,540,216 show concave solar power collectors which track movement of the sun and convert the solar radiation into heat.

U.S. Pat. No. 5,877,874 shows a holographic planar concentrator which collects optical radiation from the sun for conversion through photovoltaic cells into electrical energy. Also, fiber optic light guides transfer collected light to an interior of a building for illumination or for the purpose of producing hot water.

U.S. Pat. No. 5,581,447 shows a solar skylight apparatus in which light is collected from the sun and transmitted to the inside of a building through a fiber optic cable. The light is then dispersed within a room to provide illumination.

U.S. Pat. Nos. 4,943,125 and 5,575,860 show solar collectors that employ fiber optic fibers for use as energy sources.

A solar collection device which is efficient, powerful, and simple in construction would be a notable advance in the field of solar energy production.

SUMMARY OF INVENTION

The present invention is a novel and useful collection device for capturing and transmitting electromagnetic radiation received from the sun. The present invention incorporates a solar collector, lens(es), an infrared (IR) filter, and photovoltaic cell. Incoming solar radiation striking the face of the parabolic solar collector is reflected and concentrated at the focal point. As the radiation begins to diverge from the focal point, it enters a concave plano lens, from which it exits as a concentrated beam. This beam then passes through an infrared filter, which screens out the infrared portion of the solar spectrum, thus preventing heat damage to, and loss of efficiency of, the photovoltaic cell. The concentrated photon rich visible light portion of the spectrum then strikes and activates the photovoltaic cell, thus generating a flow of electrical energy.

The device of the present invention utilizes a reflector having a concave reflecting surface. The parabolic reflector is in general known to those skilled in the art. In such reflectors, essentially parallel rays of solar radiation are focused and concentrated at the focal point, thus, intensifying the radiation captured. The reflector is mounted on an existing-type tracking system which is also known in the art; or a novel, custom tracking system, to keep the reflecting surface in direct alignment with the sun from dawn to dusk, as the sun moves across the sky, thereby maximizing power output.

An intermediary concave-plano lens is disposed at approximately the focal point of the parabolic reflector. The curvature of the concave side of the lens is the same as the curvature of the parabolic curved concave reflector. The concave side of the lens faces the reflector and the plano side of the lens faces the IR filter and the photovoltaic cell. The plano-concave lens converts the converging electromagnetic radiation into a concentrated, parallel-beam of visible-wavelength, electromagnetic radiation.

In order to eliminate heat from infrared radiation, an infrared (IR) filter is placed between the plano-concave lens and the photovoltaic cell.

It may be apparent that a novel and useful collection device for capturing and converting electromagnetic radiation described avoce.

It is therefore an object of the present invention to provide a collection device for capturing and converting visible-wavelength, electromagnetic radiation radiating from the sun into electrical energy that is simple to manufacture and to operate.

Another object of the present invention is to provide a device for capturing and converting electromagnetic radiation from the sun into electrical energy in an efficient manner.

A further object of the present invention is to provide a collection device for capturing and converting electromagnetic radiation that is suitable for congested or urban areas.

A further object of the present invention is to avoid overheating or otherwise damaging the photovoltaic cell during transmission of focused electromagnetic radiation into electrical energy by using an infrared (IR) filter.

The invention possesses other objects and advantages especially as concerns particular characteristics and features thereof which will become apparent as the specification continues.

For a better understanding of the invention reference is made to the following detailed description of the preferred embodiments thereof which should be taken in conjunction with the prior described drawings.

DETAILED DESCRIPTION OF THE PREFERRED EMBODIMENT

The description that follows is presented to enable one skilled in the art to make and use the present invention, and is provided in the context of a particular application and its requirements. Various modifications to the disclosed embodiments will be apparent to those skilled in the art, and the general principals discussed below may be applied to other embodiments and applications without departing from the scope and spirit of the invention. Therefore, the invention is not intended to be limited to the embodiments disclosed, but the invention is to be given the largest possible scope which is consistent with the principals and features described herein.

Various aspects of the present invention will evolve from the following detailed description of the preferred embodiments thereof which should be taken in conjunction with the hereinabove delineated drawings.

Figure 1:
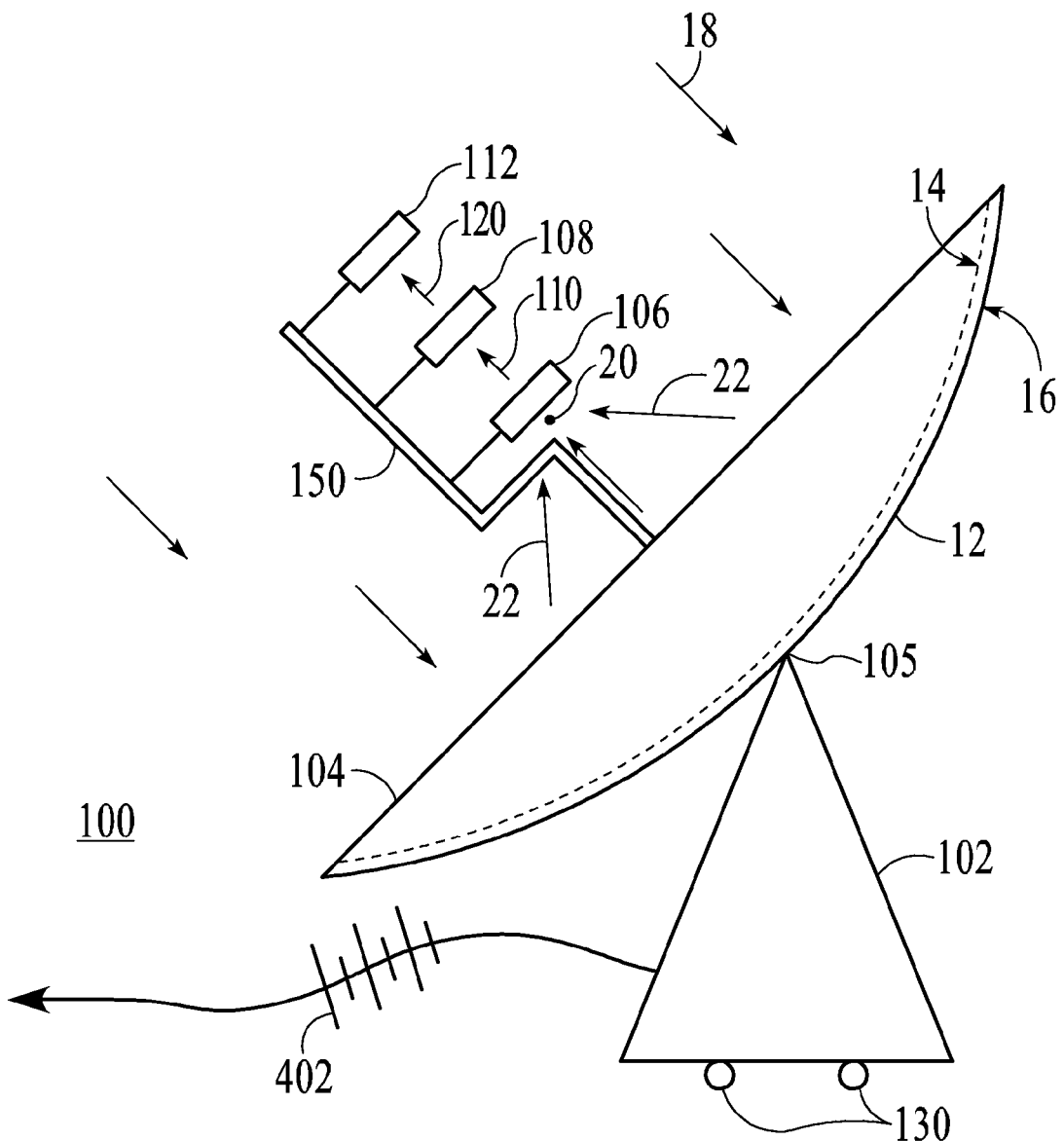
FIG. 1 is a representative side view of the concentrator-driven, photovoltaic power generator 100 of the present invention.
Figure 2:
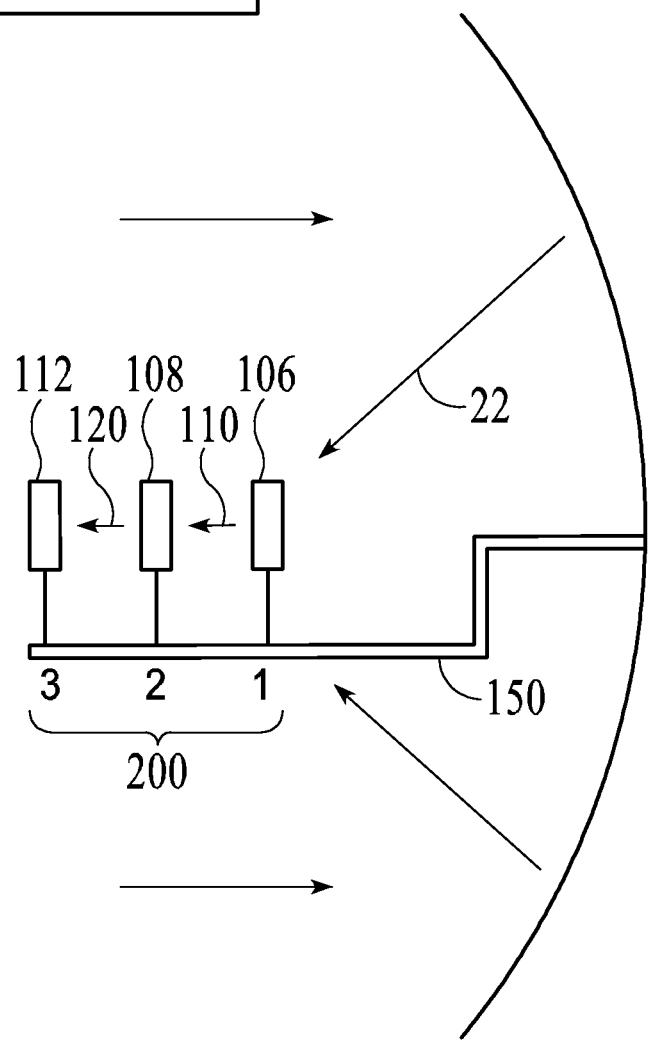
FIG. 2 is a representative sectional view of the concentrator-driven, photovoltaic power generator 100 of the present invention.

The present invention as a whole is shown in the drawings by reference character 100, and any upper case letter to represent various embodiments thereof. With respect to FIG. 1, concentrator-driven, photovoltaic power generator 100 consists of a parabolic-shaped reflector 12 and a mobile stand 102. Specifically, reflector 12 takes the form of a parabolic mirror having an inner reflecting surface 14 and an outer surface 16 which is generally non-reflective. In essence, reflecting surface 14 captures or gathers incoming parallel rays 18 from the sun. Reflecting surface 14 then reflects and focuses converging reflected rays 22 to the focal point 20. Reflected rays 22 indicate such concentration of electromagnetic radiation to focal point 20. As shown in FIGS. 1 and 2, a twice-bent hollow support tubing 150 or equivalent extends from the center of reflector 12 and provides anchor points for the electromagnetic radiation collection/storage system 200.

As shown in FIG. 1, reflector 12 is supported and elevated by mobile stand 102. In one embodiment, mobile stand 102 may be of a conventional configuration to provide a sturdy and stable base for reflector 12 in the outdoor environment. Reflector 12 is anchored, fixed, and pivots mechanically, flexibly and adjustably on mobile stand 102. Mechanical coupling device 105 such as a hinge, ball-and-socket joint, universal joint, etc., permits reflector 12 to rotate and move about its center point. This allows a controllable range of two-dimensional motion such that it is capable of tracking the sun as it travels across the sky on a daily orbital basis. Mechanical device 105 can be manually operated or controlled with an electrical/electronic motor. Support stand 102 can be mobile with wheels or other means such as wheels-and-track system 130 so the entire power generator 100 can be moved or relocated to locations that are most receptive to strong sun exposure. Since such two-axis tracking system supports are known in the art, mobile stand 102 is only partially shown in the drawings. In one embodiment, physical locations of the present invention 100 in the wheels-and-track system 130 and titling angles of reflector 12 can both be pre-programmed according to locations of the sun during the day/year.

Figure 3:
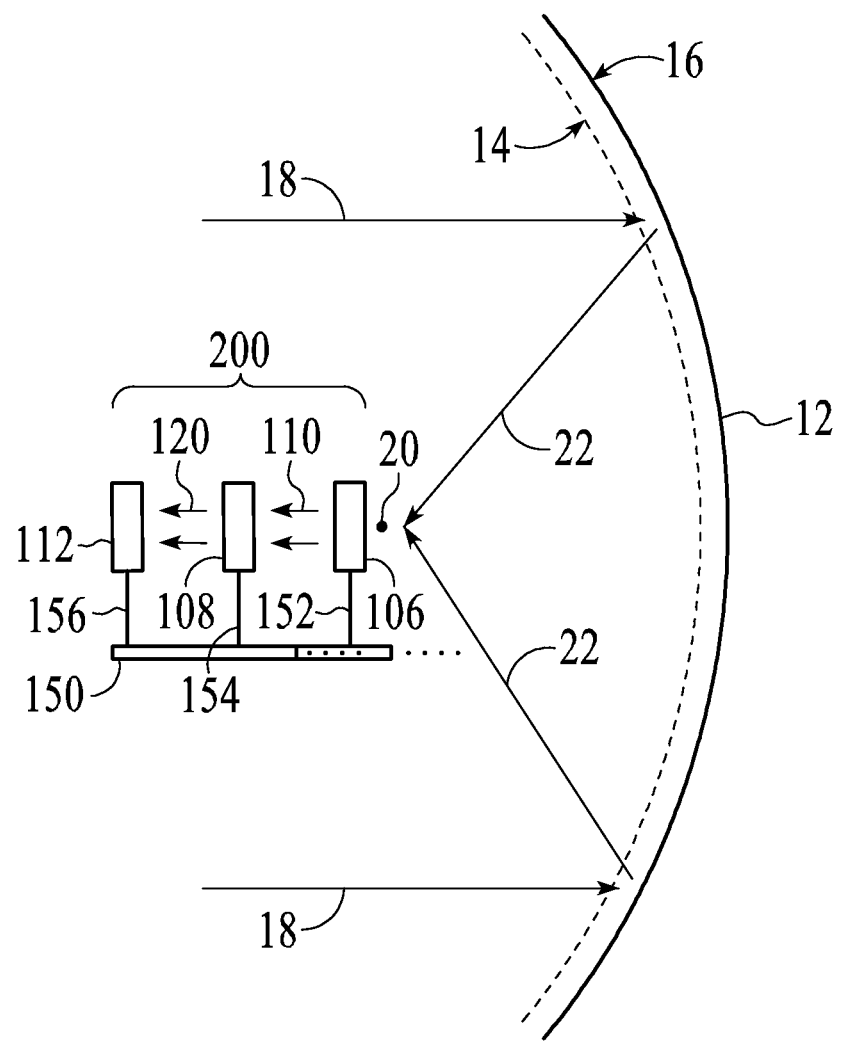
FIG. 3 is a schematic view of the mechanism of energy conversion/storage sub-system 200 of the present invention.

FIG. 2 is a representative sectional view of the concentrator-driven, photovoltaic power generator 100 of the present invention. FIG. 3 is a schematic view of the mechanism of concentrator-driven, photovoltaic power generator 200 of the present invention. Referring to FIG. 3, the concentrator-driven, photovoltaic power generator 200 consists one or more intermediary lens assembly 106, infrared filter device 108 and photovoltaic cell 112. The three elements of the concentrator-driven, photovoltaic power generator 200 are installed and supported securely by each of its support stands 152, 154 and 156 on the twice-bent hollow support tubing 150 which extends from the center of reflector 12. In one embodiment, the three elements are disposed in a straight line sequence of intermediary lens assembly 106→infrared filter device 108→photovoltaic cell 112 with the intermediary lens assembly positioned closest to reflector 12. The intermediary lens assembly is positioned at the focal point 20 where all converging reflected rays 22 from reflector 12 are gathered. In one embodiment, support tubing 150 is a hollow tubing that has a squarish cross-section and is made of steel, plastic, silicon or other sturdy and yet strong materials. It will be understood by those skilled in the art that support tubing can be substituted with equivalent structural components for achieving the same function.

In one embodiment, intermediary lens assembly 106 which is a type of optical lens fixed at the focal point 20, where the converging reflected rays or concentration of electromagnetic radiation 22 enter intermediary lens assembly 106. Intermediary lens assembly 106 can be in the form of a lens or a lens assembly that alters the converging reflected rays or concentration of electromagnetic radiation 22 into a concentrated, uni-directional flow of solar energy 110. The optical characteristics such as focal length, shape, i.e., concave, convex or combination thereof, etc., of intermediary lens assembly 106 can be adjusted according to the true dimension of the power generator 100. In one embodiment, parallel rays 18 from the sun are reflected by reflector 12 to become converging rays 22 at focal point 20. The main purpose of reflector 12 is to concentrate the energy of parallel rays 18 at focal point 20 for effective energy collection. Subsequently, at and around focal point 20, converging reflected rays 22 pass through intermediary lens assembly 106 and emerge as a concentrated, uni-directional flow of visible-wavelength solar energy 110. The present invention minimizes energy loss due to internal reflection or other reasons.

In one embodiment, intermediary lens assembly 106 is movably fixed to support tubing 150 by its support stand 152 such that the position of the intermediary lens assembly 106 can be adjusted in order to be located at or as close to the focal point 20 as possible for maximum efficiency. Since it is possible that a portion of the uni-directional flow of solar energy 110 will contained energy in the infrared wavelength-range, the system could develop overheating problems. Thus, the uni-directional flow of solar energy 110, i.e., parallel radiation, leaves intermediary lens assembly 106 and enters infrared filter device 108.

Infrared filter device 108 is an infrared cut-off filter, sometimes called an IR filter or heat-absorbing filter. In one embodiment, infrared filter device 108 is movably fixed to support tubing 150 by its support stand 154. The purpose of infrared filter device 108 is to block infrared wavelength-radiation in the uni-directional flow of solar energy 110 while passing uni-directional flow of filtered solar energy 120 to prevent overheating when it enters photovoltaic cell 112. In alternative embodiments, other types of filters such as UV filter or other wavelength-specific filters can be added or replaced as needed.

Filtered uni-directional flow of solar energy 120, i.e., parallel radiation, leaves infrared filter device 108 and enters photovoltaic cell 112. Photovoltaic cell 112 is a device that converts the photonic energy of incoming filtered visible wavelength, uni-directional flow of solar energy 120 directly into electricity by the photovoltaic effect. In one embodiment, photovoltaic cell 112 has various electrical characteristics e.g. current, voltage, or resistance to suit specific needs of the present invention 100. Generally, when photovoltaic cell 112 exposed to uni-directional flow of solar energy 120, it generates and supports an electric current without the need for any external power source.

Figure 4:
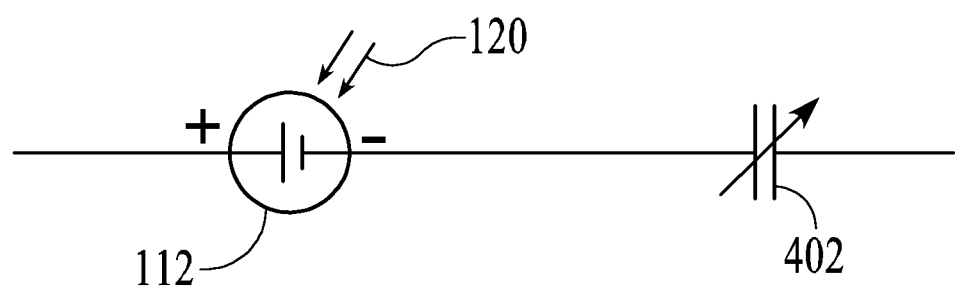
FIG. 4 is a schematic view representing transduction of solar energy into electricity.

In one embodiment, photovoltaic cell 112 is movably fixed to support tubing 150 by its support stand 156. Photovoltaic cell 112 is also connected to an electric circuit so the electrical energy generated within can be transmitted to remote locations. In one embodiment, the electric circuit can be installed within the hollow support tubing 150 or other configurations. As best shown in FIG. 4, in one embodiment, photovoltaic cell 112 converts energy from filtered uni-directional flow of solar energy 120 into electrical energy denoted by electrical potential 402. Electrical potential 402 can be coupled to a capacitor or used to recharge batteries for storage of the electrical energy generated, as desired. Alternatively, the energy potential 402 can be used to power electrical devices directly. Users can also connect energy potential 402 to a more elaborate electrical circuit with other electrical components such as transducers, transformers, etc. for other purposes, or provide electrical power to the grid, i.e., puts power back into a private or general municipal electrical power system.

While in the foregoing, embodiments of the present invention have been set forth in considerable detail for the purposes of making a complete disclosure of the invention, it may be apparent to those of skill in the art that numerous changes may be made in such detail without departing from the spirit and principles of the invention.

Although the invention herein is to be understood as described, these descriptions are merely illustrative of the principles and applications of the present invention. Therefore, it is understood that numerous modifications may be made to the illustrative embodiments and that other modifications maybe devised without departing from the scope and functions of the inventions as defined by the claims to be followed.

Unless defined otherwise, all technical and scientific terms used herein have the same meaning as commonly understood by one of ordinary skill in the art to which the present invention belongs. Although any methods and materials similar or equivalent to those described can be used in the practice or testing of the present invention, the preferred methods and materials are now described. All publications and patent documents referenced in the present invention are incorporated herein by reference.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted to specific environments and operative requirements without departing from those principles. The appended claims are intended to cover and embrace any and all such modifications, with the limits only of the true purview, spirit and scope of the invention.

I claim:

1. A concentrator-driven, photovoltaic power generator for capturing electromagnetic radiation and converting it to electrical energy, the generator comprising:
   a. a parabolic reflector having an outer edge, a concave reflecting surface, and an opposite surface, the concave reflecting surface receiving electromagnetic radiation from a source and concentrating the reflected electromagnetic radiation to a focal point;
   b. a hollow and elongated supporting beam extended outwardly from the center of the concave reflecting surface of the reflector, the elongated supporting beam having a central axis, the supporting beam disposed in a manner not obstructing path of the electromagnetic radiation;
   c. an electromagnetic radiation collector sub-system, the electromagnetic radiation collector sub-system further comprising a lens, an infrared filter device and a photovoltaic cell, the lens disposed in front of the concave reflecting surface essentially at the focal point of the reflector, the lens, filter and photovoltaic cell each installed perpendicular to the central axis of the elongated supporting beam, the lens mounted onto its own separate movable, positioning support member, the filter mounted onto its own separate movable, positioning support member, and the photovoltaic cell mounted onto its own separate movable, positioning support member, each movable positioning support member mounted onto an angled coupling located at the end of the elongated supporting beam, the angled coupling comprising a first portion that extends a short distance at a right angle to the elongated supporting beam, the angled coupling comprising a second portion that extends a short distance in a direction at a right angle to the first portion and in a direction parallel to the central axis, each of the separate movable, positioning support members coupled to the second portion such that by adjustment of the respective movable positioning support members, each of the lens, filter and photovoltaic cell can be securely and independently positioned at a very precise location relative the focal point of the parabolic reflector, the lens positioned to receive and convert the reflected, converging visible wavelength electromagnetic radiation into a uni-directional beam of visible-wavelength electromagnetic radiation to permit the uni-directional electromagnetic radiation emanating from the lens to enter and travel through the infrared filter device, the infrared filter device disposed intermediate the lens, the electromagnetic radiation collector sub-system adapted to filter out infrared wavelength electromagnetic radiation and convert the uni-directional beam of electromagnetic radiation into a single, filtered uni-directional beam of electromagnetic radiation to permit the filtered uni-directional beam of electromagnetic radiation to enter the photovoltaic cell, the photovoltaic cell disposed intermediate the infrared filter device, the photovoltaic cell adapted to convert the filtered uni-directional beam of electromagnetic radiation into electrical energy.

2. The power generator of claim 1 further comprising:
   d. a support stand having a base and a top, said top further including coupling mechanism to adjustably fasten the opposite surface of the reflector to provide support and permit rotation and other movement simultaneously of the reflector.

3. The power generator of claim 2 in which said coupling mechanism comprises a ball-and-socket joint.

4. The power generator of claim 2 in which said coupling mechanism comprises a hinge joint.

5. The power generator of claim 2 in which the support stand is made mobile by a traveling system.

6. The power generator of claim 2 in which the traveling system is wheels on tracks.

7. The power generator of claim 6 in which the coupling mechanism and the traveling system are pre-programmed by a computer system, allowing the power generator to attain the best position and the reflector to attain the best tilting angle for maximum exposure to the electromagnetic radiation from the source.

8. The power generator of claim 1 further comprising:
   e. an electrical circuit, the electrical circuit connected to the photovoltaic cell, adapted to receive, transmit, store and discharge electrical energy generated.

9. The power generator of claim 8 in which the electrical circuit further comprises a plurality of capacitors, the capacitors adapted to store the generated electrical energy electrostatically in an electric field.

10. The power generator of claim 8 in which the electrical circuit further comprises a plurality of batteries, the batteries adapted to store the generated electrical energy chemically.

\* \* \* \* \*